United States Patent [19]
Fujii

[11] Patent Number: 5,561,626
[45] Date of Patent: Oct. 1, 1996

[54] SEMICONDUCTOR MEMORY WITH HIERARCHICAL BIT LINES

[75] Inventor: Yasuhiro Fujii, Kawasaki, Japan

[73] Assignee: Fujitsu Limited, Kawasaki, Japan

[21] Appl. No.: 491,762

[22] Filed: Jun. 19, 1995

[30] Foreign Application Priority Data

Nov. 28, 1994 [JP] Japan .................................. 6-293050

[51] Int. Cl.⁶ .............................. G11C 11/24; G11C 5/06
[52] U.S. Cl. .............................. 365/149; 365/63; 365/72; 365/230.03
[58] Field of Search ............................ 365/149, 230.03, 365/63, 72, 190

[56] References Cited

U.S. PATENT DOCUMENTS 5,367,488  11/1994  An ...................... 365/230.03
5,495,440  2/1996  Asakura ...................... 365/230.03

*Primary Examiner*—Tan T. Nguyen
*Attorney, Agent, or Firm*—Armstrong, Westerman, Hattori, McLeland & Naughton

[57] ABSTRACT

A semiconductor memory with hierarchical bit lines has a plurality of local bit lines, a plurality of global bit lines, a plurality of word lines, a plurality of memory cells each arranged at a connection portion between each local bit line and each word line, and a plurality of transfer gates. The local bit lines are connected to the global bit line through the transfer gates, which are arranged near the centers of the local bit lines. This arrangement realizes a high-speed operation and a low power consumption without increasing the number of local bit lines.

10 Claims, 9 Drawing Sheets

SEMICONDUCTOR MEMORY WITH HIERARCHICAL BIT LINES

BACKGROUND OF THE INVENTION

1. Field of the Invention

The present invention relates to a semiconductor memory, and more particularly, to a semiconductor memory with hierarchical bit lines.

2. Description of the Related Art

Recent semiconductor technology has developed highly-integrated, large-capacity semiconductor memories. These memories must operate at a high speed and with low power consumption.

The capacity of semiconductor memories such as DRAMs is increasing. There are even 64- or 256-megabit DRAMs. To handle an enormous quantity of data and match with high-speed peripheral devices, these memories must operate at a high speed and with low power consumption. The low power consumption feature is particularly important when the memories are adopted for book-type personal computers and portable equipment driven by batteries.

To satisfy these requirements, semiconductor memories with hierarchical bit lines have been studied and proposed. In the related art, the hierarchical bit lines are built using multilayer metal wiring and include global bit lines and polysilicon or polycide local bit lines. The global bit lines are connected to the local bit lines through transfer gates. Among the transfer gates, only those for a memory cell array involving an accessed word line are turned ON, to reduce the capacitance and time constant of the bit lines.

In the related art, the local bit lines are connected to the global bit lines through the transfer gates which are arranged at one end of each local bit line. Note that the global bit lines are complementary signal lines.

When the level of a row address strobe signal is changed from high to low, a bit line reset signal is changed from a high-potential source voltage to a low-potential source voltage. If the local bit line select signal is set to select the corresponding local bit lines, these local bit lines are connected to the global bit lines. Thereafter, one of the word lines is selected, and the contents of a memory cell connected to the selected word line are transferred to the global bit lines through the local bit lines.

Since the transfer gates are arranged at one end of each the local bit line, the resistance and signal transmission time constant of each of the bit lines are large and elongate the read time. To shorten the read time in which a sufficient voltage difference is produced in the bit lines, the length of the local bit lines must be shortened and the number of the local bit lines must be increased. In addition, the number of the transfer gates, and of the signal lines for controlling the transfer gates, must be increased.

The semiconductor memory of the related art employs complementary global bit lines made of metal such as aluminum. The interval between the two global bit lines cannot be reduced due to a manufacturing limit, to thereby limit the degree of integration. The problems of the related art will be explained hereinafter, in detail, with reference to the accompanying drawings.

SUMMARY OF THE INVENTION

An object of the present invention is to provide a semiconductor memory capable of operating at a high speed, and with low power consumption, without increasing the number of local bit lines. Another object of the present invention is to halve the number of metal global lines of a semiconductor memory, to improve the degree of integration of the memory.

According to the present invention, there is provided a semiconductor memory with hierarchical bit lines comprising a plurality of local bit lines; a plurality of global bit lines; a plurality of word lines; a plurality of memory cells each arranged at a connection portion between each of the local bit lines and each of the word lines, and a plurality of transfer gates each arranged near the centers of the local bit lines, to connect the local bit lines to the global bit line.

Further, according to the present invention, there is also provided a semiconductor memory with hierarchical bit lines comprising a plurality of local bit lines, a plurality of global bit lines, a plurality of word lines, a plurality of memory cells each arranged at a connection portion between each of the local bit lines and each of the word lines, wherein the difference between a potential of said global bit line and a reference voltage is amplified.

A plurality of pairs of the local bit lines may be provided for each of the global bit lines. The semiconductor memory may further comprise a plurality of sense amplifier units each amplifying a potential of the global bit line. Each of the sense amplifier units may comprise a current mirror amplifier for amplifying a difference between a potential of the global bit line and a reference voltage, and an inverter for inverting an output signal from the current mirror amplifier and supplying an inverted signal to the global bit line.

The sense amplifier unit may include a first sense amplifier and a second sense amplifier next to the first sense amplifier, and the semiconductor memory may further comprise wiring arranged between the global bit line connected to the first sense amplifier and a global bit line connected to the second sense amplifier, the wiring receiving cell counter potential to reduce mutual interference between the adjacent global bit lines.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the related art will be explained.

Figure 1:
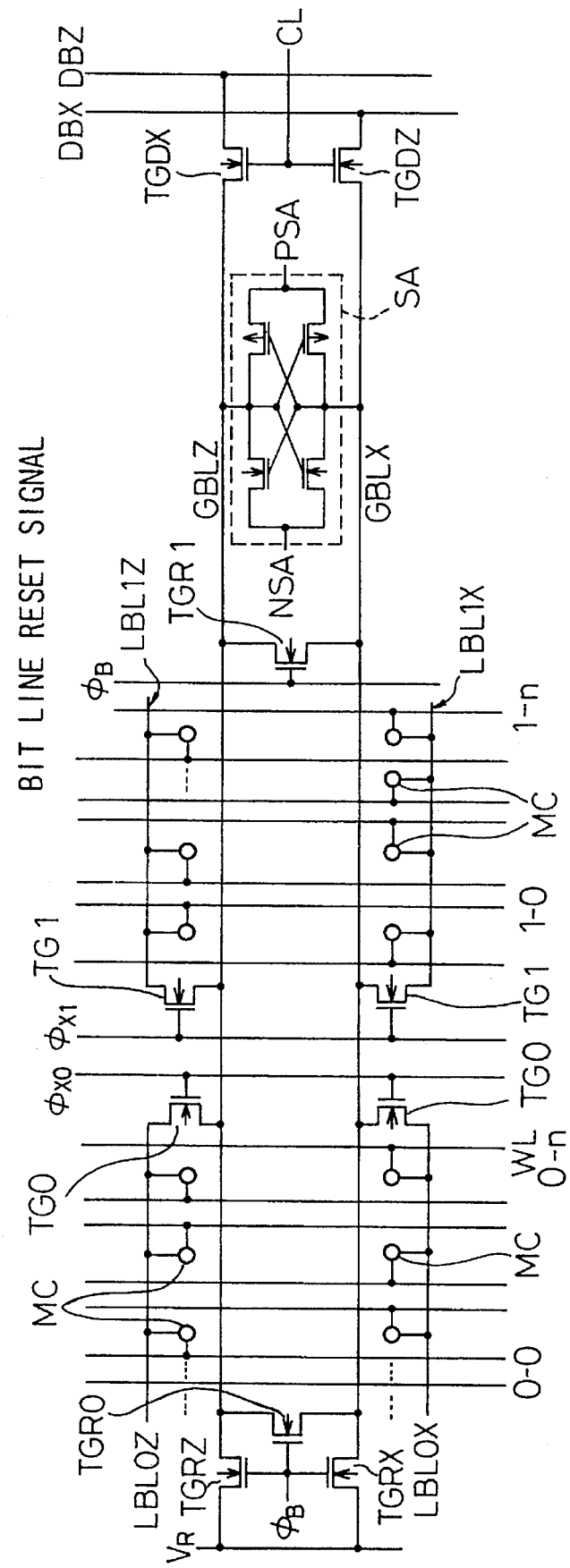
FIG. 1 is a circuit diagram showing a semiconductor memory according to a related art.

FIG. 1 is a circuit diagram showing a semiconductor memory according to the related art. This memory includes global bit lines GBLX and GBLZ, local bit lines LBL0X, LBL0Z, LBL1X, and LBL1Z, word lines WL, data lines DBX and DBZ, transfer gates TG0 and TG1, a sense amplifier SA, memory cells MC, select signals $\phi$X0 and $\phi$X1 for local bit lines, a column select signal CL, reset transfer gates TGRX, TGRZ, TGR0, and TGR1, and a reference voltage VR. The memory cells MC are arranged at the intersections of the word lines WL and local bit lines LBL0X, LBL0Z, LBL1X, and LBL1Z. The local bit lines LBL0X and LBL0Z form a pair and correspond to n+1 word lines WL(0-0) to WL(0-n). The local bit lines LBL1X and LBL1Z form a pair and correspond to n+1 word lines WL(1-0) to WL(1-n).

The local bit lines LBL0X, LBL0Z, LBL1X, and LBL1Z are connected to the global bit lines GBLX and GBLZ through the transfer gates TG0 and TG1, which are arranged at one end of each local bit line. The global bit lines GBLX and GBLZ are complementary signal lines.

Figure 2:
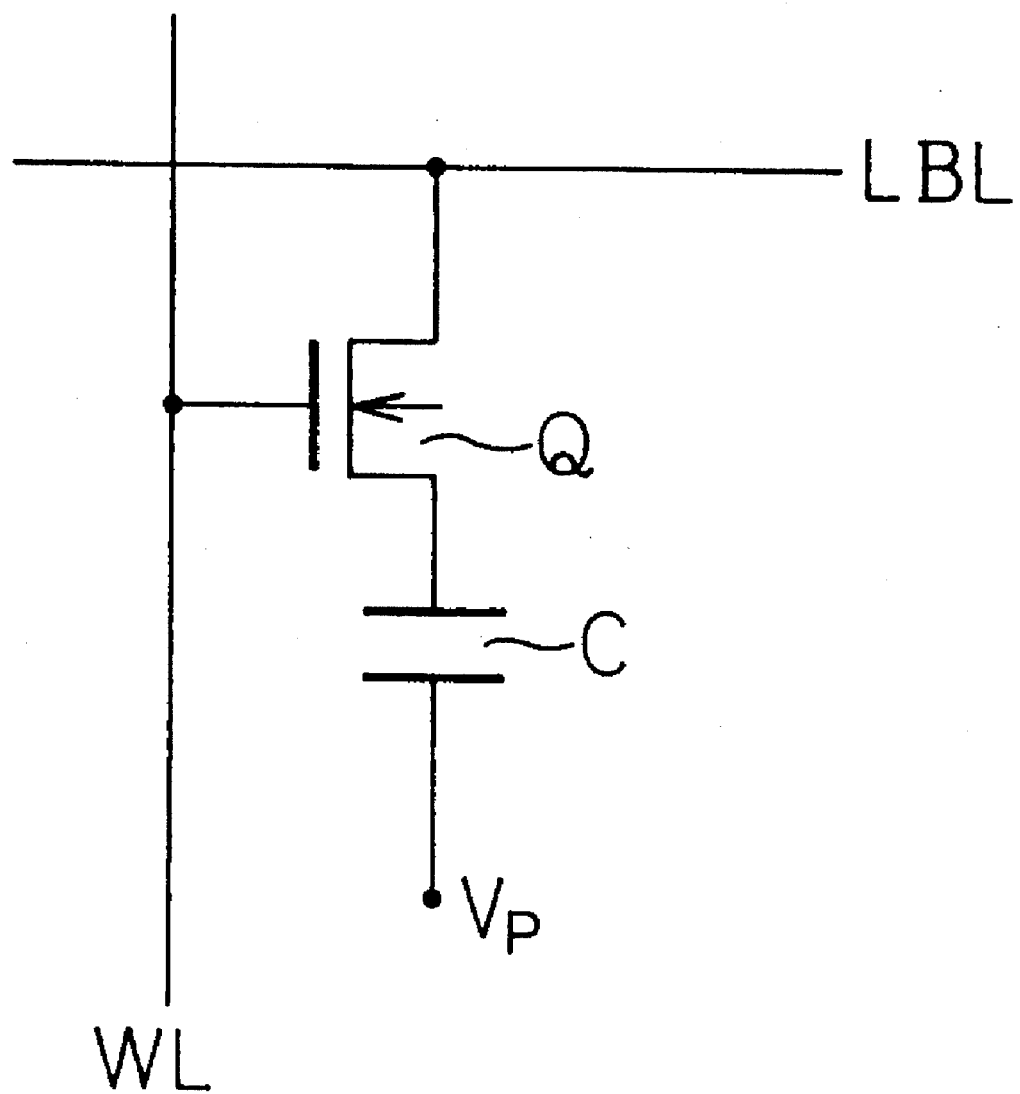
FIG. 2 is a diagram showing a memory cell of a semiconductor memory.

FIG. 2 shows a memory cell MC in a semiconductor memory. The memory cell MC consists of a gate transistor Q and a capacitor C. The drain of the transistor Q is connected to a local bit line LBL, which may be one of the local bit lines LBL0X, LBL0Z, LBL1X, and LBL1Z of FIG. 1. The gate of the transistor Q is connected to a word line WL, and the source thereof is connected to a power source Vp through the capacitor C.

As explained above, the local bit lines LBL0X, LBL0Z, LBL1X, and LBL1Z of FIG. 1 are connected to the global bit lines GBLX and GBLZ through the transfer gates TG0 and TG1, which are arranged at one end of each local bit line. The global bit lines are two complementary signal lines.

Figure 3:
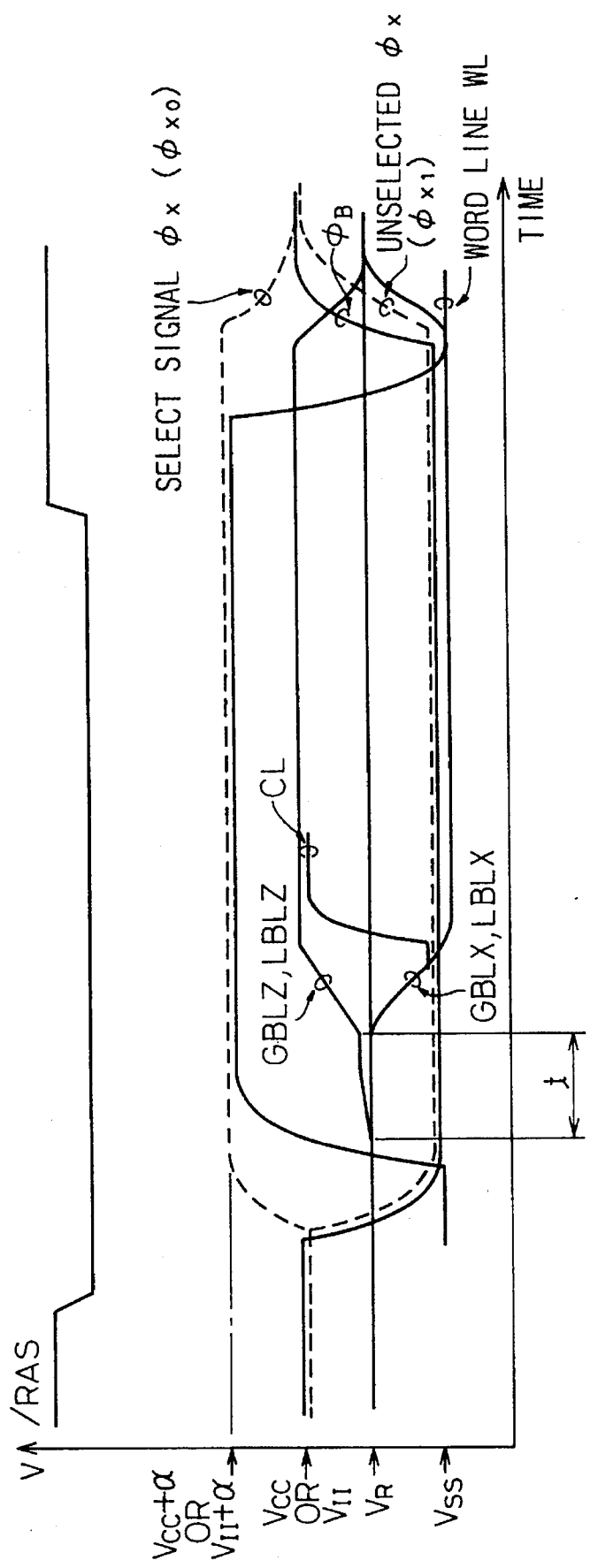
FIG. 3 is a diagram showing signal waveforms explaining the operation of the semiconductor memory of FIG. 1.

FIG. 3 shows signal waveforms explaining the operation of the semiconductor memory of FIG. 1.

When the level of a row address strobe signal/RAS is changed from high to low, a bit line reset signal $\phi$B is changed from a high-potential source voltage Vcc or Vii to a low-potential source voltage Vss. If the local bit line select signal, for example, $\phi$X0 is set to select the corresponding local bit lines LBL0X and LBL0Z, these local bit lines are connected to the global bit lines GBLX and GBLZ. Namely, the select signal $\phi$X0 is set to Vcc+$\alpha$ (or Vii+$\alpha$), to select the local bit lines LBL0X and LBL0Z. At the same time, the select signal $\phi$X1 is set to low level not to select the local bit lines LBL1X and LBL1Z.

Thereafter, one of the word lines WL is selected, and the contents of a memory cell connected to the selected word line are transferred to the global bit lines GBLX and GBLZ through the local bit lines LBL0X and LBL0Z. Since the transfer-gates TG0 are arranged at one end of each local bit line LBL0X and LBL0Z, the resistance and signal transmission time constant of each of the bit lines LBL0X and LBL0Z are large and elongate the read time t. To shorten the read time t, in which a sufficient voltage difference is produced in the bit lines LBL0X and LBL0Z or in the bit lines GBLX and GBLZ, the length of the local bit lines must be reduced and the number of the local bit lines must be increased. In addition, the number of the transfer gates, and of the signal lines for signals $\phi$X for controlling the transfer gates, must be increased.

The semiconductor memory of the related art employs complementary global bit lines GBLX and GBLZ made of a metal such as aluminum. The interval between the two global bit lines is not reducible due to a manufacturing limit, to thereby limit the degree of integration.

After the completion of the data read operation in FIG. 3, the level of the signal/RAS is changed from low to high. At the same time, the selected word line is changed to low level, and the bit line reset signal $\phi$B is changed from low level to high level to set the global bit lines GBLX and GBLZ to the reference voltage VR. The local bit line select signal $\phi$X0 is changed from Vcc+$\alpha$ (or Vii+$\alpha$) to Vcc (or Vii), to initialize the connection between the local bit lines LBL0X and LBL0Z and the global bit lines GBLX and GBLZ.

Next, the present invention will be explained.

Figure 4:
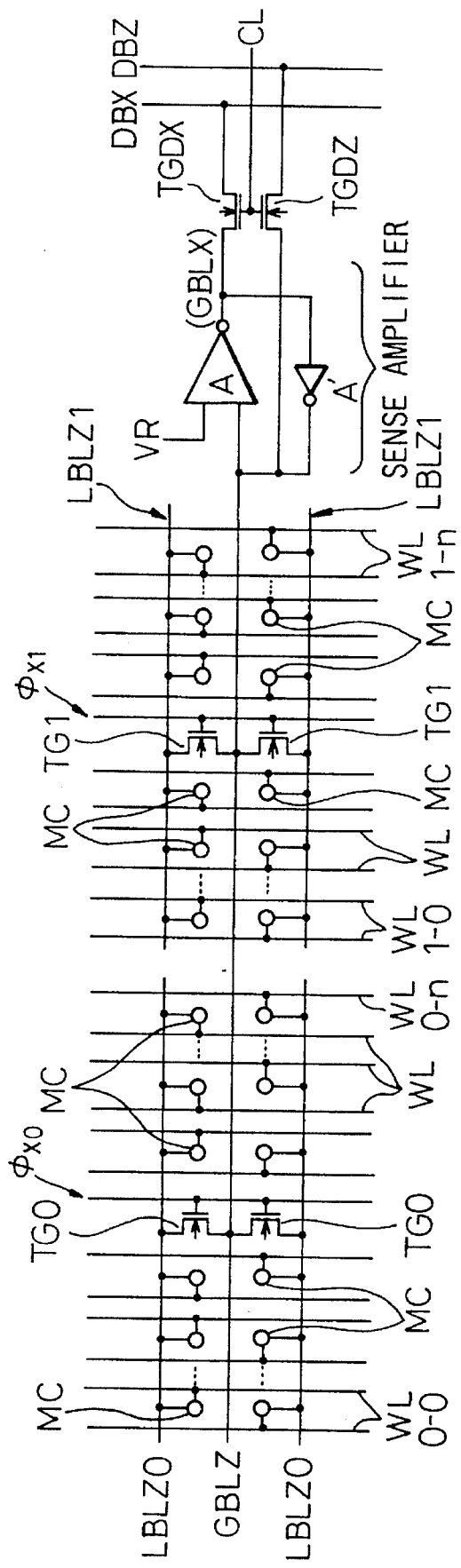
FIG. 4 is a circuit diagram showing the principle of a semiconductor memory according to the present invention.

FIG. 4 is a circuit diagram showing the principle of a semiconductor memory according to the present invention.

According to a first aspect of the present invention, the semiconductor memory employs hierarchical bit lines including local bit lines LBLZ0 and LBLZ1 and global bit lines GBLZ and GBLX. The first aspect connects the local bit lines LBLZ0 and LBLZ1 to the global bit line GBLZ through transfer gates TG0 and TG1, which are arranged at or near the centers of the local bit lines LBLZ0 and LBLZ1.

According to a second aspect of the present invention, the semiconductor memory employs hierarchical bit lines including local bit lines LBLZ0 and LBLZ1 and global bit lines GBLZ and GBLX. The second aspect connects the local bit lines LBLZ0 and LBLZ1 to the single global bit line GBLZ and amplifies a potential difference between the global bit line GBLZ and a reference voltage VR.

The first aspect of the present invention arranges the transfer gates TG0 and TG1 at or near the centers of the local bit lines LBLZ0 and LBLZ1. The second aspect of the present invention connects the local bit lines LBLZ0 and LBLZ1 to the single global bit line GBLZ and amplifies the potential difference between the global bit line GBLZ and the reference voltage VR.

The semiconductor memory of FIG. 4 includes the global bit line GBLZ, local bit lines LBLZ0 and LBLZ1, word lines WL, data lines DBX and DBZ, transfer gates TG0 and TG1, memory cells MC, local bit line select signals $\phi$X0 and $\phi$X1, a column select signal CL, and the reference voltage VR. The memory cells MC are arranged at the intersections of the word lines WL and local bit lines LBLZ0 and LBLZ1. There are a pair of the local bit lines LBLZ0 and a pair of the local bit lines LBLZ1. The local bit lines LBLZ0 correspond to n+1 word lines WL(0-0) to WL(0-n), and the local bit lines LBLZ1 correspond to n+ 1 word lines WL(1-0) to WL(1-n). The structure of each of the memory cells MC is the same as that of FIG. 2.

The local bit lines LBLZ0 and LBLZ1 are connected to the global bit line GBLZ through the transfer gates TG0 and TG1, which are arranged at or near the centers of the local bit lines LBLZ0 and LBLZ1. A distance between any one of the transfer gates TG0 and TG1 and a memory cell at an end of a corresponding one of the local bit lines LBLZ0 and LBLZ1 is half a corresponding distance of the related art. Namely, the distance between a transfer gate and an end memory cell is nearly half the length of the local bit line according to the present invention, to reduce resistance due to the bit line.

As is apparent from a comparison between FIGS. 1 and 4, the present invention connects each pair of the local bit lines LBLZ0 and LBLZ1 to the single global bit line GBLZ. On the other hand, the related art of FIG. 1 connects two pairs of the local bit lines to the complementary global bit lines GBLX and GBLZ. The present invention amplifies a potential difference between the global bit line GBLX and the reference voltage VR. Consequently, the present invention halves the number of the global bit lines, decreases the charge and discharge currents in the bit lines, and shortens the amplification time of a sense amplifier.

Figure 5:
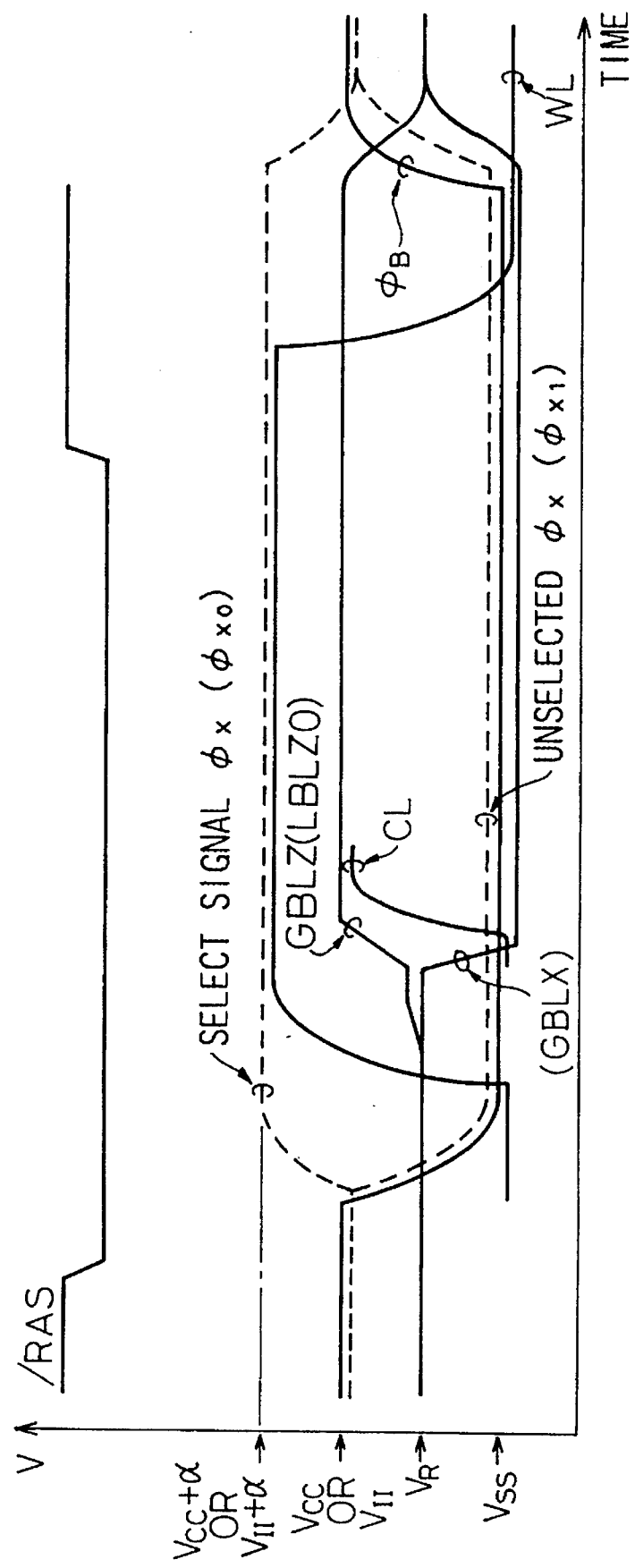
FIG. 5 is a diagram showing signal waveforms explaining the operation of the semiconductor memory of FIG. 4.

FIG. 5 shows signal waveforms explaining the operation of the semiconductor memory of the present invention of FIG. 4.

When a row address strobe signal/RAS changes from high level to low level, a bit line reset signal φB (not shown in FIG. 4) changes from a high-potential source voltage Vcc (or Vii) to a low-potential source voltage Vss. A local bit line select signal φX (φX0, φX1) is changed to select the corresponding local bit lines LBLZ0 or LBLZ1 and connect them to the global bit line GBLZ.

Then, one of the word lines WL is selected. The contents of a memory cell connected to the selected word line are transferred to the global bit line GBLZ through the selected local bit lines. Since the transfer gates TG0 (TG1) are arranged near the centers of the local bit lines LBLZ0 (LBLZ1), a change in potential due to the selected memory cell is quickly transferred to the bit lines. Even the distance of the furthest memory cell from the transfer gate TG0 is half the length of the local bit line LBLZ0. This results in reducing resistance due to the local bit lines LBLZ0 and quickly transferring a change in the potential of the local bit lines LBLZ0 due to the selected memory cell to the global bit line GBLZ. Consequently, the transition time T of FIG. 5 is about half the transition time t of FIG. 3.

A current mirror amplifier (a differential amplifier) A amplifies the difference between the potential of the global bit line GBLZ and the reference voltage VR. An output (GBLX) from the current mirror amplifier A is passed through an inverter (an amplifier) A' and is fed back to an input terminal of the current mirror amplifier A to which the global bit line GBLZ is connected. The potential of the global bit line GBLZ becomes equal to the high-potential source voltage Vcc or Vii, the potential of the output line corresponding to a global bit line GBLX changes to the low-potential source voltage Vss, and the potential of the column select signal CL changes from Vss to Vcc or Vii. Then, transfer gates TGDX and TGDZ are turned ON to transfer the potential of the signal lines GBLX and GBLZ corresponding to complementary global bit lines to the data lines DBX and DBZ.

After the completion of the data read operation, the signal/RAS is changed from low level to high level, and the selected word line to low level. At the same time, the bit line reset signal φB is set to high level from low level, to return the signal line GBLX and global bit line GBLZ to the reference voltage VR. The local bit line select signal. φX (φX0, φX1) is changed from Vcc+α (or Vii+α) to Vcc (or Vii), to initialize the connection between the local bit lines LBLZ0 and LBLZ1 and the global bit line GBLZ.

Semiconductor memories according to the embodiments of the present invention will now be explained.

Figure 6:
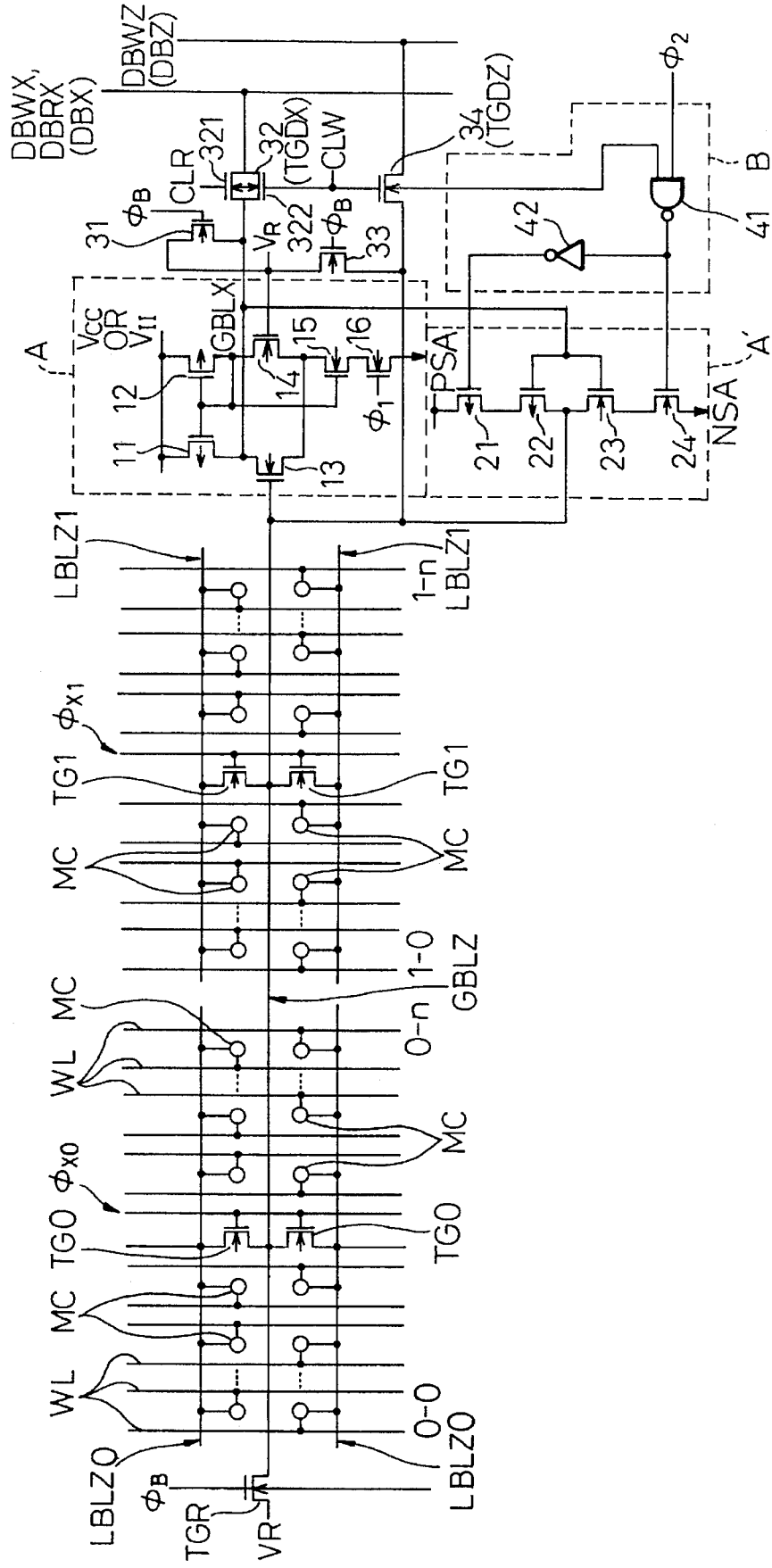
FIG. 6 is a circuit diagram showing a semiconductor memory according to an embodiment of the present invention.

FIG. 6 is a circuit diagram showing a semiconductor memory according to one of the embodiments of the present invention. The semiconductor memory includes a global bit line GBLZ, local bit lines LBLZ0 and LBLZ1, word lines WL, data lines DBX and DBZ, transfer gates TG0 and TG1, memory cells MC, local bit line select signals φX0 and φX1, a column select signal CL, and a reference voltage VR. The semiconductor memory also includes a current mirror amplifier (a differential amplifier) A, an inverter (an amplifier) A', a bit line reset signal φB, a signal φ1 for activating the current mirror amplifier A, a signal φ2 for activating a rewrite inverter, a read column select signal CLR, and a write column select signal CLW.

The memory cells MC are arranged at the intersections of the word lines WL and local bit lines LBLZ0 and LBLZ1. There are a pair of the local bit lines LBLZ0 and a pair of the local bit lines LBLZ1. The local bit lines LBLZ0 correspond to n+1 word lines WL(0-0) to WL(0-n), and the local bit lines LBLZ1 correspond to n+1 word lines WL(1-0) to WL(1-n).

The local bit lines LBLZ0 and LBLZ1 are connected to the global bit line GBLZ through the transfer gates TG0 and TG1, which are arranged at or near the centers of the local bit lines LBLZ0 and LBLZ1. Namely, the two local bit lines LBLZ0 are connected to the single global bit line GBLZ through the two transfer gates (n-channel MOS transistors) TG0, which are arranged near the centers of the local bit lines LBLZ0, respectively. Similarly, the two local bit lines LBLZ1 are connected to the single global bit line GBLZ through the two transfer gates (n-channel MOS transistors) TG1, which are arranged at the centers of the local bit lines LBLZ1, respectively. Accordingly, the distance between any one of the transfer gates TG0 and TG1 and a memory cell at an end of a corresponding one of the local bit lines LBLZ0 and LBLZ1 is half the corresponding distance of the related art of FIG. 1. Namely, the distance between a transfer gate and an end memory cell according to the embodiment is approximately half the length of the local bit line. This arrangement reduces resistance due to the bit line. The transfer gates TG0 and TG1 are switched in response to the select signals φX0 and φX1, respectively.

As is apparent from a comparison between FIGS. 1 and 6, this embodiment connects each pair of the local bit lines LBLZ0 and LBLZ1 to the single global bit line GBLZ. On the other hand, the related art of FIG. 1 connects each pair of the local bit lines to the two complementary global bit lines GBLX and GBLZ. Namely, the embodiment is capable of eliminating the global bit line GBLX. The current mirror amplifier A of the embodiment amplifies a potential difference between the global bit line GBLZ and the reference voltage VR. In this way, the embodiment halves the number of global bit lines, decreases the charge and discharge currents in the bit lines, and shortens the amplification time of a sense amplifier. A reset transistor TGR is connected to one end of the global bit line GBLZ, and a transistor 33 is connected to the other end of the global bit line GBLZ. These transistors TGR and 33 receive the bit line reset signal φB. When the bit line reset signal φB is set to high level, the global bit line GBLZ is set to the reference voltage VR. An output signal line GBLX of the current mirror amplifier A is reset to the reference voltage VR by a reset transistor 31 whose gate receives the bit line reset signal φB.

The current mirror amplifier A has p-channel MOS transistors 11 and 12 and n-channel MOS transistors 13, 14, 15, and 16. The global bit line GBLZ is connected to the gate of the transistor 13. The reference voltage VR is applied to the gate of the transistor 14. The tristate inverter (amplifier) A' has p-channel MOS transistors 21 and 22 and n-channel MOS transistors 23 and 24. Further, sources of the transistors 21 and 24 are supplied with a p-channel drive signal PSA and an n-channel drive signal NSA, respectively. The global bit line GBLZ is connected to a node between the transistors 22 and 23. The output signal line GBLX of the current mirror amplifier A is connected to the gates of the transistors 22 and 23. The gate of the transistor 24 receives the output of a NAND gate 41. The gate of the transistor 21 receives the output of the NAND gate 41 through an inverter 42. The NAND gate 41 and inverter 42 form a control circuit B, which may be provided for each column decoder and shared by a plurality of sense amplifiers. The NAND gate 41 receives the signal φ2 for activating the rewrite inverter, as well as the write column select signal CLW. The signals φ2 and CLW control the inverter A'.

The current mirror amplifier A amplifies a potential difference between the global bit line GBLZ and the reference voltage VR. The output signal line GBLX of the current mirror amplifier A and the global bit line GBLZ are connected to an input terminal of the current mirror amplifier A, to form signal lines corresponding to the complementary global bit lines GBLX and GBLZ. The potential of the signal line GBLX is passed to the data line DBX (DBWX, DBRX) through the transfer gate 32 (TGDX). The potential of the signal line GBLZ is passed to the data line DBZ (DBWZ) through the transfer gate 34 (TGDZ). The transfer gate 32 consists of a transistor 321 whose gate receives the read column select signal CLR and a transistor 322 whose gate receives the write column select signal CLW. The transfer gate 32 is selected when reading and writing data. The transfer gate 34 consists of a transistor whose gate receives the write column select signal CLW and is selected when writing data. The signal lines DBWX and DBWZ transfer write data, and the signal line DBRX transfers read data. The data line DBX serves as the write data line DBWX and the read data line DBRX.

Figure 7:
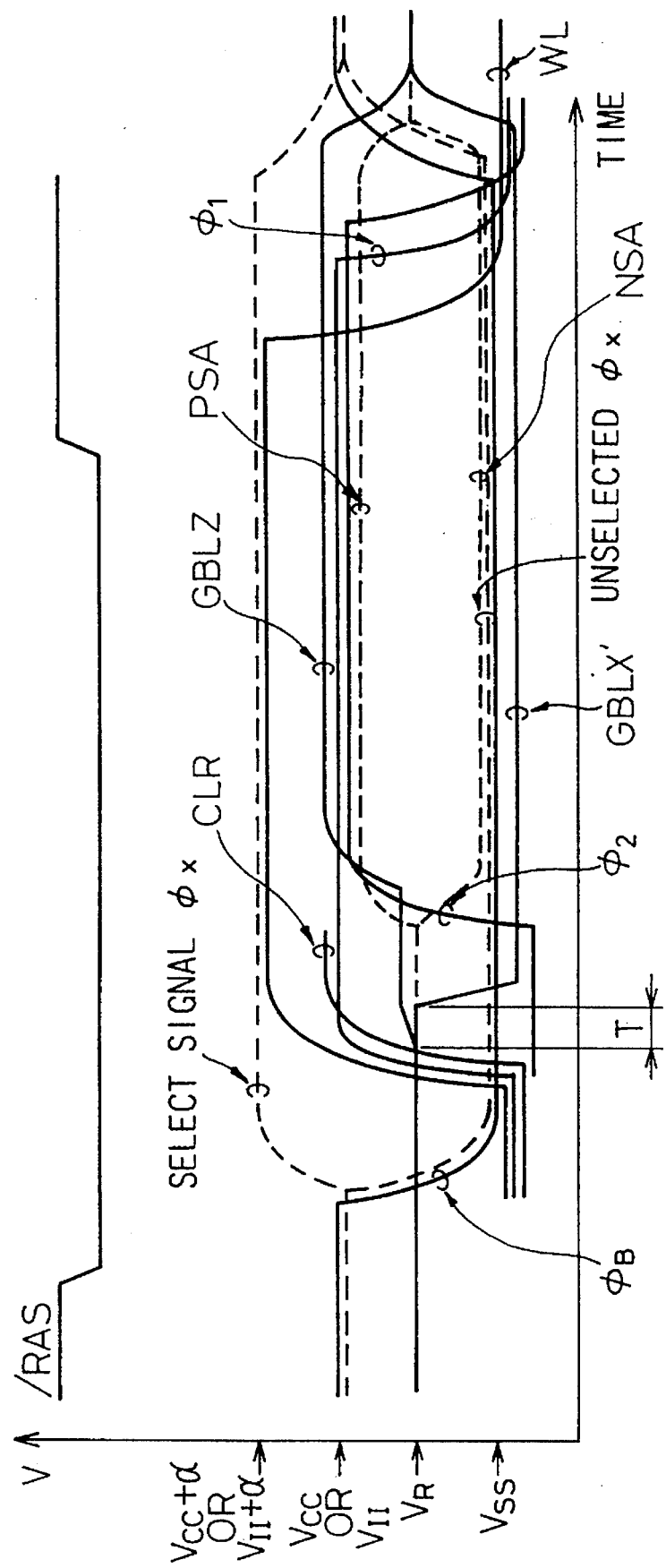
FIG. 7 is a diagram showing signal waveforms explaining a read operation of the semiconductor memory of FIG. 6.

FIG. 7 shows signal waveforms explaining a read operation of the semiconductor memory of FIG. 6.

To start the read operation, a row address strobe signal/RAS is changed from high level to low level, and the bit line reset signal φB is changed from a high-potential source voltage Vcc or Vii to a low-potential source voltage Vss. The global bit line GBLZ and the output signal line GBLX of the current mirror amplifier A are disconnected from the reference voltage VR.

In response to a change in the local bit line select signal φX (φX0, φX1), the corresponding local bit lines LBLZ0 or LBLZ1 are selected and connected to the global bit line GBLZ. More precisely, if the select signal φX0 is changed from Vcc or Vii to Vcc+α or Vii+α to establish a selected state, the two transfer gates TG0 whose gates receive the signal φX0 are turned ON to connect the two local bit lines LBLZ0 to the global bit line GBLZ. The other select signal φX1 is changed from Vcc or Vii to Vss to establish an unselected state, and the two transfer gates TG1 whose gates receive the signal φX1 are turned OFF to disconnect the two local bit lines LBLZ0 from the global bit line GBLZ. As a result, a pair of the local bit lines LBLZ0 is connected to the global bit line GBLZ.

One of the word lines WL is selected according to an address signal, and the signal φ1 is set to high level to activate the current mirror amplifier A. When the read column select signal CLR is changed to high level, the transistor 321 of the transfer gate 32 is turned ON to connect the output line GBLX of the current mirror amplifier A to the data line DBX (DBRX). The contents of a memory cell connected to the selected word line are transferred to the global bit line GBLZ through the local bit lines LBLZ0. This embodiment sets the read column select signal CLR to high level before amplifying the read signal, to connect the output line GBLX of the current mirror amplifier A to the data line DBX (DBRX), to thereby improve the speed of the read operation.

Since each transfer gate (TG0, TG1) of this embodiment is arranged at or around the center of a corresponding local bit line (LBLZ0, LBLZ1), a change in potential due to a selected memory cell is quickly transferred through the bit lines. The distance of even the farthest memory cell from the transfer gate TG0 is half the length of the local bit line LBLZ0, to thereby reduce resistance due to the local bit line LBLZ0 and quickly transfer a change in potential in the local bit line to the global bit line GBLZ. Namely, the transition time T of FIG. 7 is about half the transition time t of FIG. 3.

When the signal φ2 for activating the rewrite inverter is at high level as shown in FIG. 7, the write column select signal CLW supplied to the NAND gate 41 is at low level. Accordingly, the output of the NAND gate 41 is at high level to activate the tristate inverter A'.

Namely, the current mirror amplifier A amplifies a difference between the reference voltage VR and a change in the potential of the global bit line GBLZ (the change is from low to high in FIG. 7). The output GBLX of the current mirror amplifier A is applied to the gates of the transistors 22 and 23 of the tristate inverter A', which inverts, amplifies, and transfers the output to the global bit line GBLZ. As a result, the potential difference between the global bit line GBLZ and the output GBLX of the current mirror amplifier A is increased. Note that, the drive signals PSA and NSA, which are supplied to the sources of the transistors 21 and 24, are charged up or discharged from the reference voltage VR (stand-by level) to the voltages Vcc or Vii and Vss. The output GBLX of the current mirror amplifier A is transferred to the data line DBRX (DBX) through the transistor 321 of the transfer gate 32. Since the transfer gate transistor 34 is OFF, the potential of the global bit line GBLZ is not transferred to the data line DBZ.

After the completion of the data read operation, the signal/RAS is changed from low level to high level, and the selected word line is changed to low level. At the same time, the signal φ1 is changed from high level to low level to inactivate the current mirror amplifier A. The bit line reset signal φB is changed from low level to high level to return the global bit line GBLZ and output GBLX to the reference voltage VR. The local bit line select signal φX (φX0, φX1) is changed from Vcc+α (or Vii+α) of selected state to Vcc (or Vii), or from Vss of unselected state to Vcc (or Vii), to initialize the connection between the local bit lines LBLZ0 and LBLZ1 and the global bit line GBLZ.

In this way, this embodiment indirectly connects the global bit line GBLZ to the read signal line DBRX (DBX), so that the read column select signal CLR may be quickly activated in a read operation. When a required word line is selected, a potential change is supplied to the global bit line GBLZ with a time constant that is about half that of the related art of FIG. 1, to produce a voltage difference with respect to the reference voltage VR. Since the signal φ1 for activating the current mirror amplifier A is activated substantially together with the selected word line, the current mirror amplifier A carries out a differential amplification operation at once, to supply the memory cell information to the data line DBRX (DBX) through the transfer gate 32. In this way, the present invention realizes a high-speed access operation. The output GBLX is amplified quickly due to the small capacitance, and is completely amplified when the signal φ2 for activating the rewrite inverter is provided. Accordingly, a rewrite operation with respect to the global bit line GBLZ is also carried out at a high speed. The inverter A' causes substantially no through current, to thereby reduce current consumption. Charge and discharge currents in the bit lines are nearly half those of the related art of FIG. 1. The present invention is capable of relaxing a limit on an interval of global bit lines GBLZ twice that of the related art of FIG. 1, to reduce the line-to-line capacitance and mutual interference of global bit lines. These effects are achieved not only in the read operation but also in a write operation as explained below.

Figure 8:
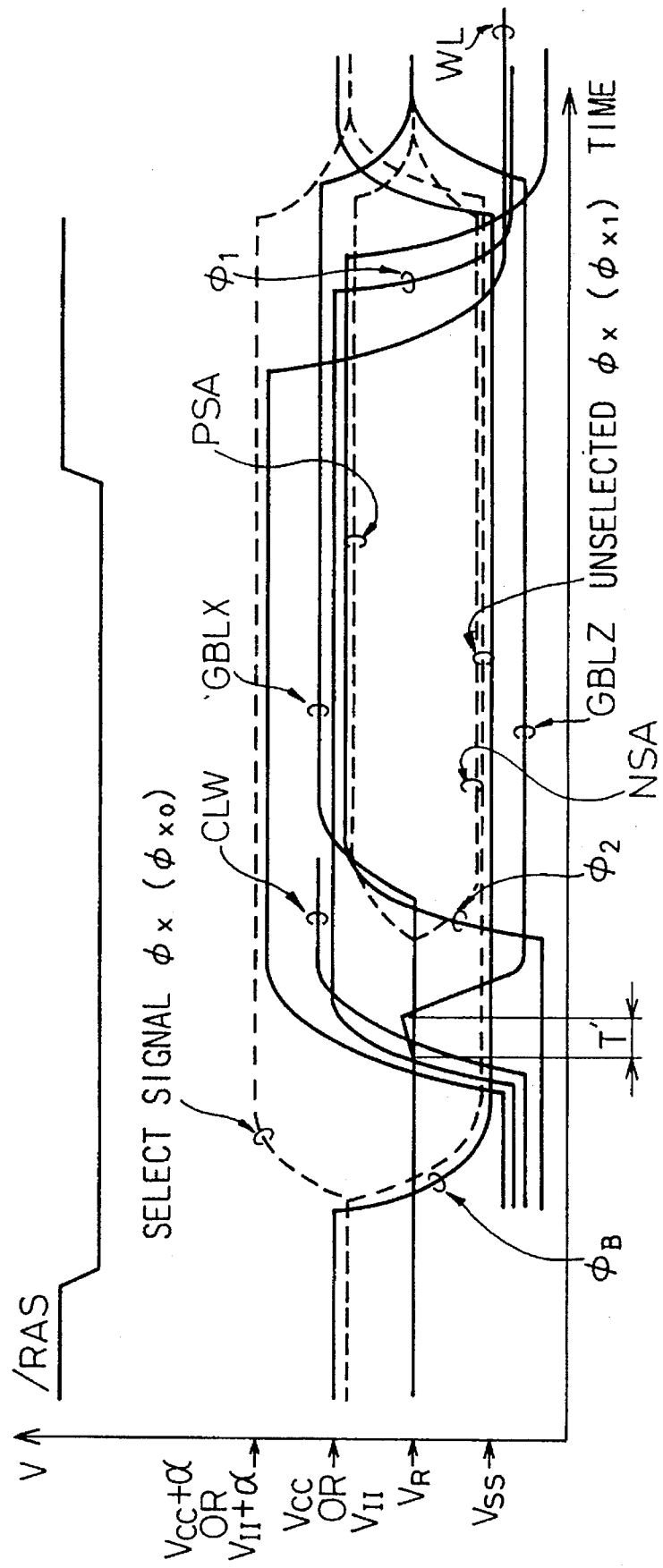
FIG. 8 is a diagram showing signal waveforms explaining a write operation of the semiconductor memory of FIG. 6.

FIG. 8 shows signal waveforms explaining the write operation of the semiconductor memory of FIG. 6.

To start the write operation, the signal /RAS is changed from high level to low level, and the bit line reset signal φB is changed from the high-potential source voltage Vcc or Vii to the low-potential source voltage Vss. As a result, the global bit line GBLZ and the output GBLX of the current mirror amplifier A are disconnected from the reference voltage VR.

When the local bit line select signal φX (φX0, φX1) is changed, the corresponding local bit lines LBLZ0 or LBLZ1 are selected and connected to the global bit line GBLZ. More precisely, if the potential of the select signal φX0 is changed from Vcc or Vii to Vcc+α or Vii+α into a selected state, the two transfer gates TG0 whose gates receive the signal φX0 are turned ON to connect the two local bit lines LBLZ0 to the global bit line GBLZ. The other select signal φX1 is changed from Vcc or Vii to Vss into an unselected state, and the two transfer gates TG1 whose gates receive the signal φX1 are turned OFF to disconnect the two local bit lines LBLZ1 from the global bit line GBLZ. In this way, a pair of the local bit lines LBLZ0 is connected to the global bit line GBLZ.

One of the word lines WL is selected in response to an address signal. The signal φ1 is changed to high level to activate the current mirror amplifier A. When the write column select signal CLW is changed to high level, the transistor 322 of the transfer gate 32 is turned ON, to connect the output GBLX of the current mirror amplifier A to the data line DBX (DBWX), and the transistor 34 is turned ON to connect the global bit line GBLZ to the data line DBZ (DBWZ).

At this time, the signal φ2 for activating the 10 rewrite inverter is changed to high level, and the output of the NAND gate 41 is changed to low level. As a result, the gate of the transistor 21 receives a high-level signal through the inverter 42, and the gate of the transistor 24 receives a low-level signal, so that the inverter A' stays in an OFF state.

For example, the data lines DBWX (DBX) and DBWZ (DBZ) provide signals to set the potential of the global bit line GBLZ to the low level of Vss and the potential of the line GBLX to high level, to thereby write data into a selected memory cell. This embodiment arranges the transfer gates TG0 (TG1) at or near the centers of the local bit lines LBLZ0 (LBLZ1), to quickly transfer a change in the potential of the bit lines to the selected memory cell. Even if the selected memory cell is farthest from the transfer gate TG0, its distance is half the length of the local bit line LBLZ0. This arrangement reduces resistance due to the bit line to quickly transfer a write voltage in the bit line to the selected memory cell in the short time T' in FIG. 8.

After the completion of the data write operation, the signal /RAS is changed from low level to high level, and the level of the word line is changed to low level. At the same time, the signal φ1 is changed from high level to low level to inactivate the current mirror amplifier A. The bit line reset signal φB is changed from low level to high level, to return the global bit line GBLZ and line GBLX to the reference voltage VR. The local bit line select signal φX (φX0, φX1) is changed from the selected state of Vcc+α or Vii+α to Vcc or Vii, or from the unselected state of Vss to Vcc or Vii, to initialize the connection between the local bit lines LBLZ0 and LBLZ1 and the global bit line GBLZ.

As explained above, the resistance of a bit line according to the present invention is nearly half that of the related art of FIG. 1. This results in halving a time of producing a voltage difference in the global bit line GBLZ supplied to the gate of the current mirror amplifier (differential amplifier) A. Since the output GBLX of the current mirror amplifier A is indirectly connected to the global bit line GBLZ, the output GBLX is quickly amplified flue to the small capacitance. Since the output GBLX is quickly amplified, the amplification performance of the inverter A' is increased to quickly amplify a signal in the global bit line GBLZ. As a result, a current passing through the inverter A' during an indefinite period is reduced. Instead of amplifying the two complementary bit lines of the related art, the present invention amplifies only the single global bit line GBLZ, to thereby reduce current consumption. Since only one global bit line GBLZ is connected to a sense amplifier, the interval between the global bit lines will be twice that of the related art of FIG. 1, to provide a margin in a pattern layout. Generally, the metal global bit lines hinder high integration. The present invention is capable of doubling the interval between global bit lines without reducing the degree of integration. Namely, the present invention is capable of increasing the degree of integration by determining the intervals of global bit lines according to manufacturing processes and metal wiring processes. The margin in a pattern layout may improve the yield of the DRAMs.

Figure 9:
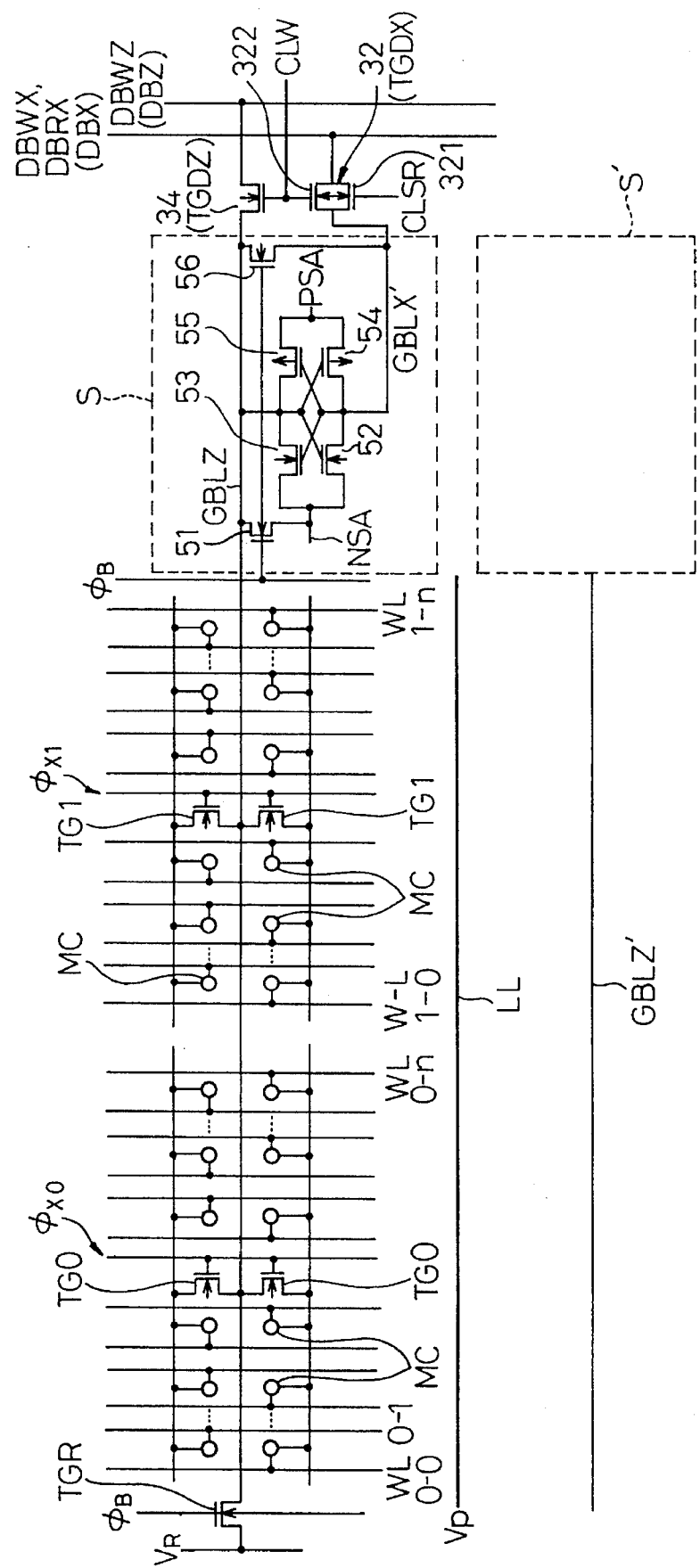
FIG. 9 is a circuit diagram showing a semiconductor memory according to another embodiment of the present invention.

FIG. 9 is a circuit diagram showing a semiconductor memory according to another embodiment of the present invention.

As is apparent from a comparison between FIGS. 6 and 9, the embodiment of FIG. 9 employs a sense amplifier S serving as the current mirror amplifier (differential amplifier) A, tristate inverter (amplifier) A', and control circuit B of FIG. 6. A transfer gate transistor 34 and a transfer gate 32 consisting of transistors 321 and 322 are the same as those of FIG. 6.

The sense amplifier S consists of n-channel MOS transistors 51, 52, 53, and 56 and p-channel MOS transistors 54 and 55. The transistors 52 and 53 are connected crosswise to the transistors 54 and 55. A node between the gates of the transistors 52 and 54 and a node between the drains of the transistors 53 and 55 are connected to a global bit line GBLZ and to a signal line DBZ (DBWZ) through the transfer gate 34. A node between the gates of the transistors 53 and 55 and a node between the drains of the transistors 52 and 54 provide a signal GBLX' and are connected to a signal line DBX (DBWX, DBRX) through the transfer gate 32. The sources of the transistors 51, 52 and 53 are connected to a node that receives a signal NSA. The sources of the transistors 54 and 55 are connected to a node that receives a signal PSA. The signals NSA and PSA drive and control the sense amplifier S. The drains of the transistors 51 and 56 are connected to the global bit line GBLZ.

In this way, the semiconductor memory of the present invention may employ the current mirror amplifier A and inverter A' of FIG. 6, or the sense amplifier S of FIG. 9.

The sense amplifier S helps reduce the number of elements. The signal GBLX', however, is easily affected by amplification noise of the global line GBLZ. To avoid this, wiring LL that receives a cell counter potential Vp is arranged between the global line GBLZ and a global line GBLZ' of an adjacent sense amplifier S', to reduce mutual interference and noise between the adjacent global bit lines GBLZ and GBLZ'. When the wiring LL receiving the cell counter potential Vp is arranged between the adjacent global bit lines GBLZ and GBLZ', the intervals of metal wiring will be the same as that of the related art of FIG. 1, so that there will be no advantage in a pattern layout. This embodiment, however, is capable of achieving a high-speed read operation and a low power consumption.

As explained above in detail, the present invention provides a semiconductor memory having transfer gates arranged at or near the centers of local bit lines, to thereby realize a high-speed operation and a low power consumption without increasing the number of local bit lines.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory with hierarchical bit lines comprising:

a plurality of local bit lines;

a plurality of global bit lines;

a plurality of word lines;

a plurality of memory cells each arranged at a connection portion between each of said local bit lines and each of said word lines, and a plurality of transfer gates each arranged around a center of said local bit lines, to connect said local bit lines to said global bit line.

2. A semiconductor memory as claimed in claim 1, wherein a plurality of pairs of said local bit lines are provided for each of said global bit lines.

3. A semiconductor memory as claimed in claim 1, wherein said semiconductor memory further comprises a plurality of sense amplifier means each amplifying a potential of said global bit line.

4. A semiconductor memory as claimed in claim 3, wherein each of said sense amplifier means comprises a current mirror amplifier for amplifying a difference between a potential of said global bit line and a reference voltage, and an inverter for inverting an output signal from said current mirror amplifier and supplying an inverted signal to said global bit line.

5. A semiconductor memory as claimed in claim 3, wherein said sense amplifier means includes a first sense amplifier and a second sense amplifier next to said first sense amplifier, and said semiconductor memory further comprises a wiring arranged between said global bit line connected to said first sense amplifier and a global bit line connected to said second sense amplifier, said wiring receiving cell counter potential to reduce mutual interference between said adjacent global bit lines.

6. A semiconductor memory with hierarchical bit lines comprising a plurality of local bit lines, a plurality of global bit lines, a plurality of word lines, a plurality of memory cells each arranged at a connection portion between each of said local bit lines and each of said word lines, wherein a difference between a potential of said global bit line and a reference voltage is amplified.

7. A semiconductor memory as claimed in claim 6, wherein a plurality of pairs of said local bit lines are provided for each of said global bit lines.

8. A semiconductor memory as claimed in claim 6, wherein said semiconductor memory further comprises a plurality of sense amplifier means each amplifying a potential of said global bit line.

9. A semiconductor memory as claimed in claim 8, wherein each of said sense amplifier means comprises a current mirror amplifier for amplifying the difference between a potential of said global bit line and a reference voltage, and an inverter for inverting an output signal from said current mirror amplifier and supplying an inverted signal to said global bit line.

10. A semiconductor memory as claimed in claim 8, wherein said sense amplifier means includes a first sense amplifier and a second sense amplifier next to said first sense amplifier, and said semiconductor memory further comprises wiring arranged between said global bit line connected to said first sense amplifier and a global bit line connected to said second sense amplifier, said wiring receiving a cell counter potential to reduce mutual interference between said adjacent global bit lines.

* * * * *